(12) United States Patent
H V et al.

(10) Patent No.: US 9,844,724 B2
(45) Date of Patent: Dec. 19, 2017

(54) HIGH SPEED CALCULATION OF MAGNETIC FORCES AND COLLISION DETECTION BETWEEN COIN CLUSTERS IN MAGNETIC CAROM

(71) Applicants: Saranya H V, Trivandrum (IN); Prasanna Gorur Narayana Srinivasa, Bangalore (IN); Pratheek Kolagunda Ananthmurthy, Bangalore (IN)

(72) Inventors: Saranya H V, Trivandrum (IN); Prasanna Gorur Narayana Srinivasa, Bangalore (IN); Pratheek Kolagunda Ananthmurthy, Bangalore (IN)

( * ) Notice: Subject to any disclaimer, the term of this patent is extended or adjusted under 35 U.S.C. 154(b) by 266 days.

(21) Appl. No.: 14/409,524

(22) PCT Filed: Jun. 21, 2013

(86) PCT No.: PCT/IN2013/000388
§ 371 (c)(1),
(2) Date: Dec. 19, 2014

(87) PCT Pub. No.: WO2013/190576
PCT Pub. Date: Dec. 27, 2013

(65) Prior Publication Data
US 2015/0321102 A1    Nov. 12, 2015

(30) Foreign Application Priority Data
Jun. 21, 2012    (IN) ............................ 2463/CHE/2012

(51) Int. Cl.
*A63F 13/00*    (2014.01)
*A63F 13/57*    (2014.01)
*A63F 13/573*    (2014.01)
*A63F 13/577*    (2014.01)
*G01R 33/00*    (2006.01)

(52) U.S. Cl.
CPC ............ *A63F 13/57* (2014.09); *A63F 13/573* (2014.09); *A63F 13/577* (2014.09); *G01R 33/0064* (2013.01)

(58) Field of Classification Search
CPC ....... A63F 13/21; A63F 13/214; A63F 13/828
See application file for complete search history.

(56) References Cited

U.S. PATENT DOCUMENTS

| | | | | | |
|---|---|---|---|---|---|
| 3,989,244 A | * | 11/1976 | Wadina | ................ | A63D 15/006 473/2 |
| 4,142,720 A | * | 3/1979 | Davis | ..................... | A63B 37/00 264/239 |
| 5,082,274 A | * | 1/1992 | Bright | ................. | A63F 11/0011 273/138.2 |
| 2006/0261765 A1 | * | 11/2006 | Prasanna | .............. | H02K 49/046 318/400.01 |

* cited by examiner

*Primary Examiner* — James S McClellan
(74) *Attorney, Agent, or Firm* — Laurence P. Colton; Smith Tempel Blaha LLC (57) ABSTRACT

The present invention describes a system and method of high speed calculation of magnetic forces and collision detection between coin clusters in the graphical simulation of magnetic carom game, which has facilities of high speed calculation of magnetic forces, collision and dynamics in between the coins and coin clusters. Therefore, our invention is an interactive game simulation, which solves the problem of collision detection involving aggregates in an efficient manner.

7 Claims, 13 Drawing Sheets

Figure 24

HIGH SPEED CALCULATION OF MAGNETIC FORCES AND COLLISION DETECTION BETWEEN COIN CLUSTERS IN MAGNETIC CAROM

BACKGROUND

Field of the Invention

The present invention describes a system and method of high speed gaming engine by high speed calculation of magnetic force and collision detection between the coin clusters in magnetic carom.

Discussion of Prior Art

This application extends the description in Indian patent application 2684CHE2010, and the contents therein are incorporated by reference. Also, the material in our US patents on motion control using electromagnetic forces—U.S. Pat. Nos. 7,348,754, 7,733,050, 8,299,741 and succeeding US patents and associated patents pending in EPO and India, and US patent application 20130006589 "Electrical Mechanisms, Design Methods and Properties"—is incorporated by reference.

State of the Art

Computing magnetic fields and forces on magnetized objects is a common problem in electrical and mechanical engineering applications.

One category of methods includes the virtual work method, Maxwell's stress tensor method and equivalent source methods. The latter category comprises the equivalent magnetic charge method, the equivalent magnetizing current method and the equivalent magnetic dipole method. These methods are widely used for analysis of magneto-mechanical systems. A comparative study of these methods can be found in [Delfino et al. 2001; de Medeiros et al. 1998]. Most of these methods rely on finite element (FE) computations for the computation of the external magnetic field. For an interactive simulation, such an approach is not feasible due to high numerical costs.

Nicolet, A, 1996; uses Runge-Kutta methods for transient magnetic field computation [6]. Barton, M. L., 1987; pioneered to solve three dimensional magnetic field computation problems, using a vector finite element approximation function [7].

B. Thomaszewski et al., 2008; uses symmetric equivalent magnetic dipole approach to solve rigid body dynamics in the presence of magnetic field and have used Maxwell's magneto-static equations to solve the problem [1]. Rigid body dynamics in the presence of magnetism is similar to our present invention, but the slight difference is that the implementation of our present invention focuses on the fact that the scenario is an interactive game simulation. To make the simulation faster, simple computations are performed on pre-computed magnetic field values.

Finally, all the concepts from magneto statics used in this work are well-known and detailed explanations can be found [8, 9].

Yet another entirely different and separate problem solved as a result of the invention relates to the simulation of coin clusters. Aggregation similar to that of magnetic coins can be seen in chemical reactions where molecules form aggregates and disperse in real time. A set of partial differential equations model such as aggregation and dispersion at a specific level and the modelling software solves a set of such equations. J. Gregory et. al, 1995; gives a detailed explanation of the complete simulation of deposition and aggregation of small solid particles from a liquid dispersion [10]. Aggregate modelling including collision detection, breaking of aggregates and a variety of simulation methods are discussed in depth. Collision detection in graphical simulation for games and other applications is a field in which a lot of research has already occurred. Ming C. Lin et. Al, 1998; survey the state of the art in collision detection between general geometric models [11].

SUMMARY

Figure 24:
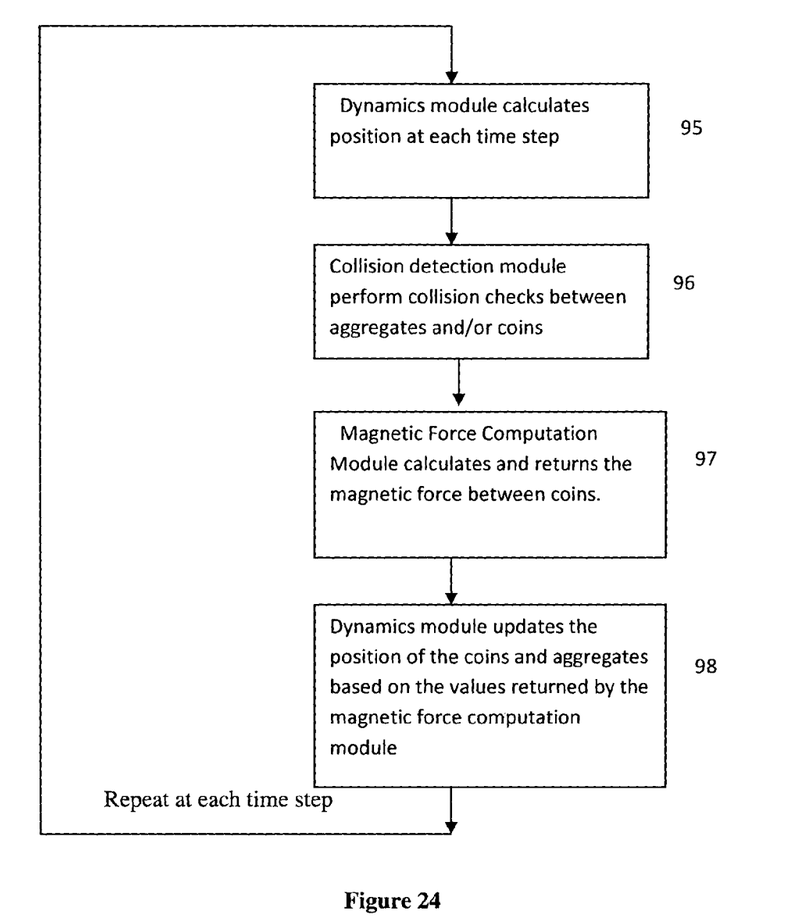
FIG. 24 shows a flowchart of the simulator.

The background about the magnetic carom game is discussed in the present invention. The context of the work done in the invention relate to the simulation of this game (FIG. 24). Many interesting situations arise in the game that are unique and have never been implemented in any game development scenario. The most important factor is magnetism that is rarely involved in other games. This game explores the scope of involving magnetism along with dynamics in a board game environment. The conventional counterpart is the carom game, which is a 4 player game, similar to snooker. It is played on a square board, with 4 pockets, one at each corner of the board. Points are scored by players by pocketing the coins by hitting it with a striker. There are 16 black coins, 16 white coins and one red coin, which is called the Queen. All the coins are identical with respect to size and shape. All the coins are made of the same material. Only the striker is larger than the other coins and is typically made of plastic or some other lighter material.

Magnetic Carom is a multiplayer game (with at most 4 players). It has a square board with a striker and some small size coins (one red, nine black and nine white). The coin pieces contain magnets. The present invention aims to create a simulator for the same. Here, the problems of dynamics in the presence of electromagnetic field is solved. For simulating dynamics in a magnetic environment, a rigorous approach would solve Maxwell's equation at each time step. This is computationally impractical for use in a game simulation, which is expected to have low response time. Our invention speeds up the computation using a pre-computed database. There can be a hybrid approach of using the magnetic field values as initial values for a numerical approach for solving Maxwell's equation. The present method is based on pre computation of field values, hard coded in a database. The calculation of magnetic forces experienced by each coin is done using this method. This is combined with the application of laws of vector superposition to the field vectors due to each magnet. In addition to this, the concept of aggregate formation during the game is explored. The coins being magnetic, leads to formation of complex aggregates of coins during the course of the game. The aggregate of coins is a non convex body. Once an aggregate is formed, its behaviour depends on its center of mass and shape. While modelling the dynamics of aggregate formation and disintegration, there is a need to implement collision detection between the aggregates and/or the coins. The context being an interactive game simulation, the speed of such an implementation is very important. The present invention solves the problem of collision detection involving aggregates in an efficient manner.

There are multifarious uses of present invention. One embodiment enables the users to both select magnetized coins and play a simulated game and then have the pieces manufactured if needed.

DETAILED DESCRIPTION OF THE INVENTION

Figure 1:
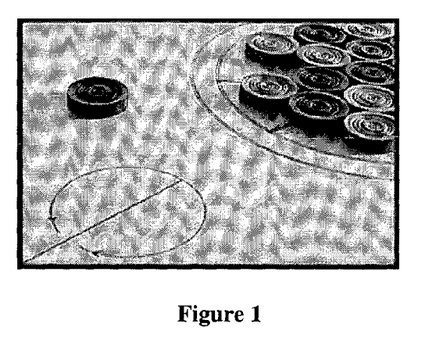
FIG. 1 shows a typical carom board and coins.

FIG. 1 shows a typical carom board and coins. In Magnetic Carom, the coins are the same as in conventional carom, the only difference being magnets embedded in them. The magnetic forces cause the motion of the striker and/or coins to change direction, multiple coins to move together as a unit, coins to repel each other, etc without any visible collision or imposed external force. The resulting "swing areas (repulsive)" and "traps (attractive areas)" of the striker and/or coins make the game fascinating. Coins stick to and/or repel each other, at the locations where their magnetic poles lie. Proper strategies has been devised in present invention to avoid putting coins in the vicinity of the swing and trap areas, where is it difficult to control them (unless a very high degree of mastery is achieved where the magnetic field is used in advantage). Similar strategies have to be devised to handle the coins sticking to each other and moving as a composite coin.

Figure 2:
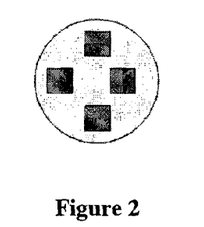
FIG. 2 shows a carom coin embedded with 4 magnets.

FIG. 2 shows the top view of a sample coin, embedded with magnets, used in the game. During the simulation of the game, there should be accurate calculation of magnetic forces between coins. An efficient implementation for calculating magnetic forces using pre-computed databases is proposed in the present invention. Another contribution of the invention is a fast implementation of collision detection between clusters of magnetized coins.

Aggregate Formation in Magnetic Carom

The coins used in magnetic carom are cylindrical in shape, with the radius being larger than the thickness of the coin. Clearly, this is a convex body. The magnets are embedded within the coins, which doesn't change the inherent cylindrical appearance of the coins. The coins with magnets and without magnets appear identical in shape and size. When the magnetized coins are hit using a striker, they may hit other magnetized coins on the way to the pocket. As the coins are magnetized, even if a coin moves in close proximity to another coin, the magnetic fields due to both of them may affect each other, resulting in a change of track of either coin. The coins may attract or repel from each other, depending upon the configuration of magnets in each coin.

If we consider a case when two coins attract and consequently attach to each other at points where magnets are embedded, the strong magnetic force of attraction holds the coins together. This is termed as an aggregate of coins. When a striker/coin hits this aggregate, two events can possibly occur. One of them being, the movement of the entire aggregate as a single unit with a velocity determined by that of the striker and the other is the disintegration of the aggregate leading to the separation of coin(s) from the aggregate. As the game progresses, a variety of complex aggregates may be formed. Some of these may be a straight chain of coins whereas some may be a circular or triangular arrangement of coins. Sometimes, more complex shapes may also be formed, as outlined in Indian patent application [23].

Figure 3:
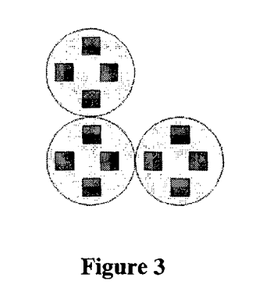
FIG. 3 shows aggregation of coins due to magnetic force.
Figure 4:
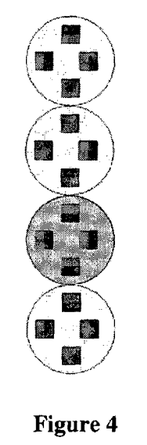
FIG. 4 shows aggregation of coins due to magnetic force.
Figure 5:
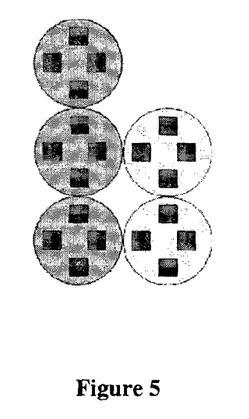
FIG. 5 shows aggregation of coins due to magnetic force.

FIGS. 3, 4, and 5 show some of the aggregates that can be formed, when the coins have 4 magnets. The magnets are shown on the coins as coloured rectangles. The red coloured end shows North Pole and the blue coloured one shows South Pole. According to the FIGS. 3, 4 and 5, each of the coins has 4 magnets, spaced equally along the periphery. Only the direction of poles may vary in each case. While simulating such coins graphically, we should have this data regarding the configuration of magnets inside each coin. This is required to simulate the formation of aggregates accurately. Same is the case with modelling the disintegration of coins. While simulating the behaviour of these aggregates, one needs to keep track of the centre of mass of the same. The behaviour of an aggregate depends on its centre of mass and the magnetic force of attraction between individual coins, constituting the aggregate. It should be noted that the aggregate is a non convex body, whose centre of mass varies as coins attach to or detach from the aggregate.

Coins used in the magnetic carom contain magnets embedded within them. The carom board is logically viewed as a set of grid points. Depending on the number and configuration of magnets within each coin, the magnetic forces exerted on other coins vary. In order to calculate the force exerted on a coin by other coins, we should have the distribution of magnetic field intensity experienced by a unit charge at each point on the grid. A modelling tool is used called magnetic field software to determine the magnetic field intensity due to a permanent magnet. Once the field values due to a single magnet is made available at every point in the grid, the field due to other magnets positioned at different angles and co-ordinate positions can be calculated. This is done by shifting and rotating the field originally modelled with a single magnet placed at the origin.

Figure 6:
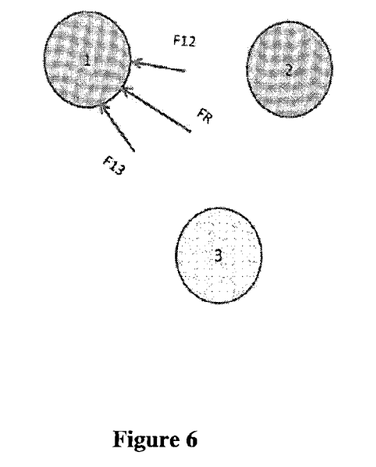
FIG. 6 shows forces acting between 3 magnetized coins.
Figure 7:
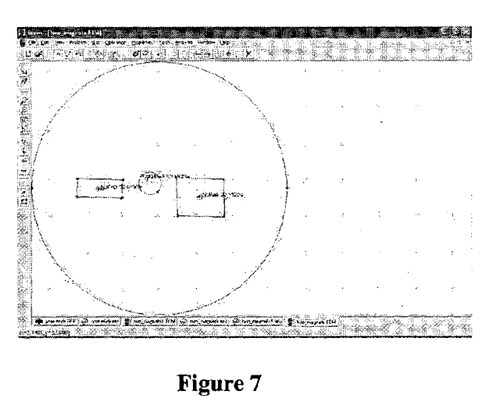
FIG. 7 shows a simple model of three different shaped nyodimium magnets.
Figure 8:
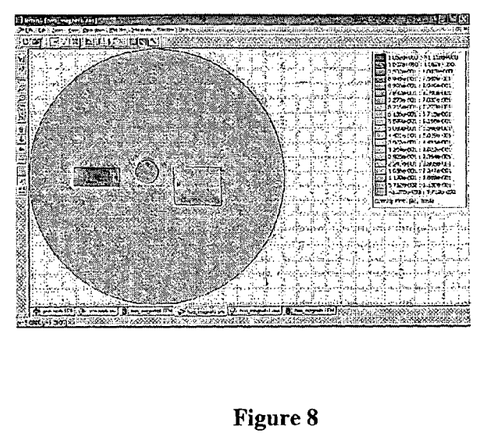
FIG. 8 shows field strength of resulting magnetic intensity from magnetic field software.

FIG. 6 shows the nature of force acting between magnetized coins and their resultant. F12 is the equal and opposite force acting between coins 1 and 2. F13 is the equal and opposite force acting between coins 1 and 3. FR is the resultant force on coin 1 due to coins 2 and 3. When there is more number of coins, the resultant can be calculated iteratively using the vector superposition formula for two vectors. Force between magnets of different sizes can be calculated by a process similar to scaling.

Physics Engine Development

The embodiment adds the force in the database to all the other forces in a carom simulation using a standard physics engine such as Blender.

Implementation

We have modelled magnet as a current carrying solenoid. The field computation therefore uses the following formulae.

The following formulae help us to understand the relation between the force exerted by an object F, the magnetic field intensity B and distance r.

a) Lorentz Force formulation in terms of Magnetic Field $$F=q[E+(v\times B)] \quad (1)$$

where
F is the force (in Newton) E is the electric field (in volts per meter)
B is the magnetic field (in teslas) q is the electric charge of the particle (in coulombs), v is the instantaneous velocity of the particle (in meters per second)
x is the vector cross product.

b) Biot-Savart law for formulation of Magnetic Field B with respect to the distance r.

Where
I is the current
dl is a vector, whose magnitude is the length of the differential element of the wire, and whose direction is the direction of conventional current,
B is the net magnetic field,
μ0 is the magnetic constant,
r̂ is the displacement unit vector in the direction pointing from the wire element towards the point at which the field is being computed.

c) Formula to calculate the magnitude and orientation of the resultant Vector $$mag(V)=\sqrt{V1^2+V2^2+2V1V2\cos(\theta)}$$

$$Angle(V)=\tan^{-1}(V1/V2)$$

Where
V1 and V2 are two vectors and V is their resultant. θ is the angle between V1 and V2.

Magnetic Field Software

Both ANSYS and FEMM are used to do the field calculations, both of these are well known in the state-of-art.

Figure 9:
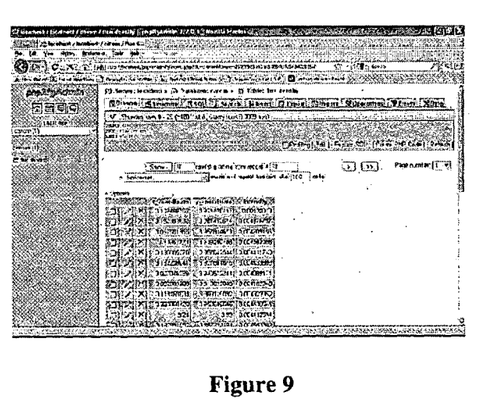
FIG. 9 shows a simple database schema and captured values from magnetic field software.

For each configuration of magnets, the magnetic field software generates field intensities (or alternatively forces exerted on another magnet of nominal strength). The generated intensity files have the details of the resulting field intensities. The coordinates and their respective field intensity is computed and stored in the file in a readable format. All these values are then entered into a CSV (comma separated value) format spreadsheet and then imported into a database (mySQL) for later use. FIG. 9 illustrates a simple database schema and captured values from magnetic field software.

Fast Collision Detection Between Aggregates

As the coins are magnetized, they may stick to each other forming aggregates during the game. The speciality of these aggregates are that, they are irregular bodies and their center of mass varies as new coins may add to the aggregate or coins may detach themselves from the aggregate as a result of striking force strong enough to break the magnetic force of attraction. These aggregates are non convex bodies. The original coins are solid cylinders; therefore the simulation of the game in 2D can be done by approximating these coins using circles. When the collision between coins and/or aggregates has to be checked, the coins that are on the boundary of the aggregate can be found and checked with them only. But to speed up this process, each aggregate can be approximated using a bounding box or a circular bounding region and intersection with the convex region which can be computed in a fast manner. The aggregate formation in magnetic carom game does not lead to any random form of non-convex shapes. It doesn't have any sharp peaks or dips. Its shape depends on the configuration of the magnets inside the coins. According to FIG. 2, each of the coins has 4 magnets spaced equally along the periphery. Only the direction of poles may vary in each case. While simulating such coins graphically, we should have this data regarding the configuration of magnets inside each coin. This is required to simulate the formation of aggregates accurately. Same is the case with modelling the disintegration of coins.

Methods for Detecting Collision

The coins used in magnetic carom being cylindrical in shape, an approximation in 2D can be circles for the same. A brute force method to find collision can be a pair wise check between every coin in an aggregate to all other coin of the other aggregate. This is the case when only 2 aggregates are on the board at an instant. It might be the case that there is 'm' such aggregates on the board at a time. This leads to an O(m^2 n^2) computation if we consider each aggregate as that constituting of 'n' coins. A further optimization over this method will be to involve only the boundary coins of each aggregate in pair wise checks. But, this method proves to be effective only when the aggregates formed are large enough so that there are a sufficient number of coins embedded within the boundary that will not participate in the pair wise checks.

A faster way to detect collision is to approximate the entire aggregate with a closely fitting bounding volume. The bounding volume being convex will facilitate easier collision detection. The reason is that, finding intersection between convex bodies is easier than that between non convex bodies. The result of two methods is presented here to find collision between aggregates using bounding volumes. The bounding volumes used are circular bounding volume and bounding box respectively.

Circular Bounding Area

An aggregate is represented as a multiple linked list with each list having a distinct coin as its head of the list. The rest of the elements of the list are simply those coins that are directly attached to the coin that is at the head of the list. In this way, if there are 'n' coins in the aggregate, there will be 'n' number of linked lists, each with one of the 'n' coins at the head. When an aggregate is formed, its center of mass is calculated by only traversing through the head of each list. This is an operation with complexity O(n). A bounding circle is constructed with the centre as the centre of the aggregate. Primary collision detection is done with such bounding circles. If the bounding circles overlap, the aggregates may or may not collide. In such a case, absolute collision detection is calculated between the coins. The technique to speed up such absolute collision detection is to check for collision among the boundary coins only. When aggregates are represented using an adjacency list, the coins that form extremities of the aggregates can be found out by some simple calculations. After doing this for an aggregate, collision detection is restricted to pair wise checks between such boundary coins. Recomputation for identifying the boundary coins is done only when the aggregate changes its shape.

Figure 10:
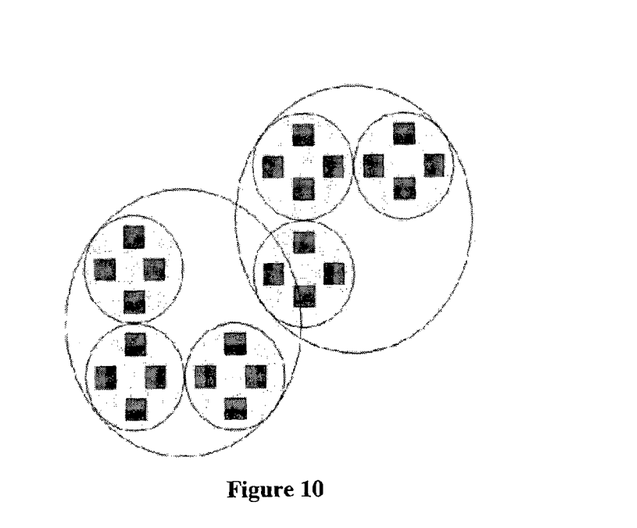
FIG. 10 shows an approximation of aggregates using bounding circle.

FIG. 10 shows an approximation using bounding circle where the intersection of the two bounding circle does not lead to collision between aggregates.

Figure 21:
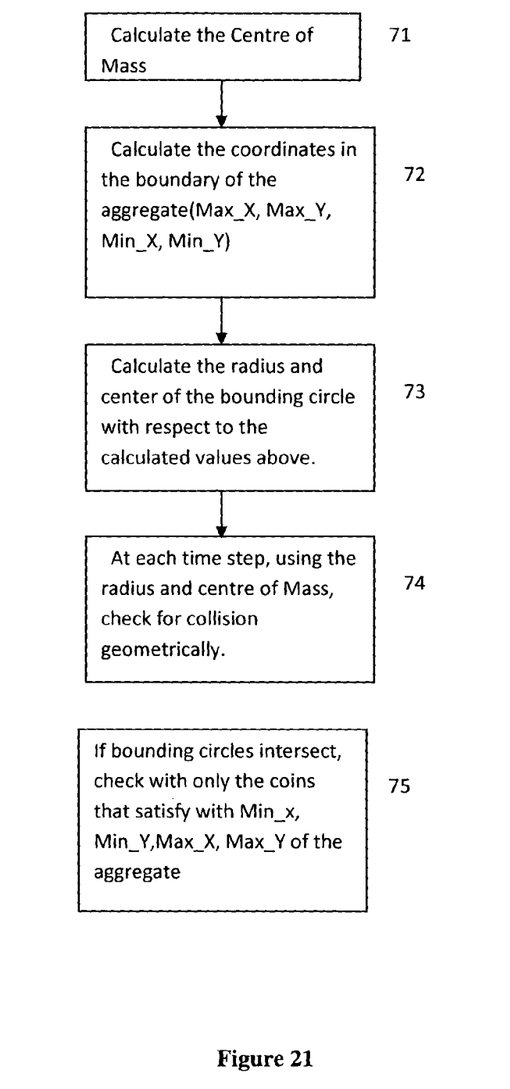
FIG. 21 shows a flowchart summarizing the method of circular bounding area.

The flowchart in FIGS. 21 (71 to 75) summarizes the method of circular bounding area.

Union of Rectangular Bounding Boxes

A rectangular bounding area is used to tightly bind portions of the aggregates in 2D, so that the approximation is much more accurate. The aggregate is conceptually broken down into sub aggregates over which a bounding box can be applied easily. After this, the aggregate can be viewed as a collection of bounding boxes, each encapsulating a disjoint portion of the aggregate. Every aggregate is modelled this way and then intersection is checked.

For conceptually breaking down the aggregates into disjoint set of chained coins, the following method is applied to the aggregate structure. The angle between every adjacent coin, say theta, is computed and is populated in a two dimensional array. The coins with same angle theta with their adjacent coins are obtained. Now, from this two dimensional array, the coins that are connected in a chain is found out using their adjacency information. This will group the coins into disjoint sets. For each of these sets, a bounding rectangle is created, tightly covering the group of coins. Intersection between bounding rectangles belonging to different aggregates indicates a possibility of collision in this case. If the bounding rectangles do not intersect, collision has not occurred. In the case when the bounding rectangles do intersect, pair wise checking with the boundary coins is continued, which is a method of actual collision detection.

Figure 11:
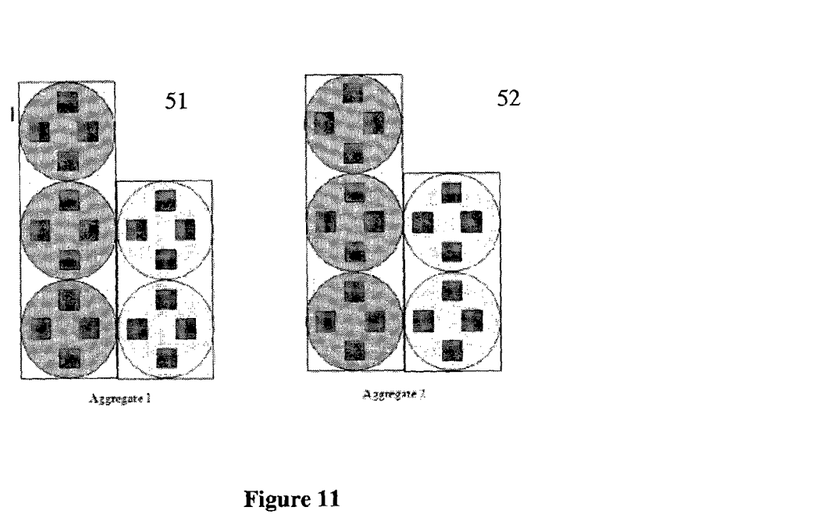
FIG. 11 shows an approximation of aggregates using bounding rectangle.
Figure 22:
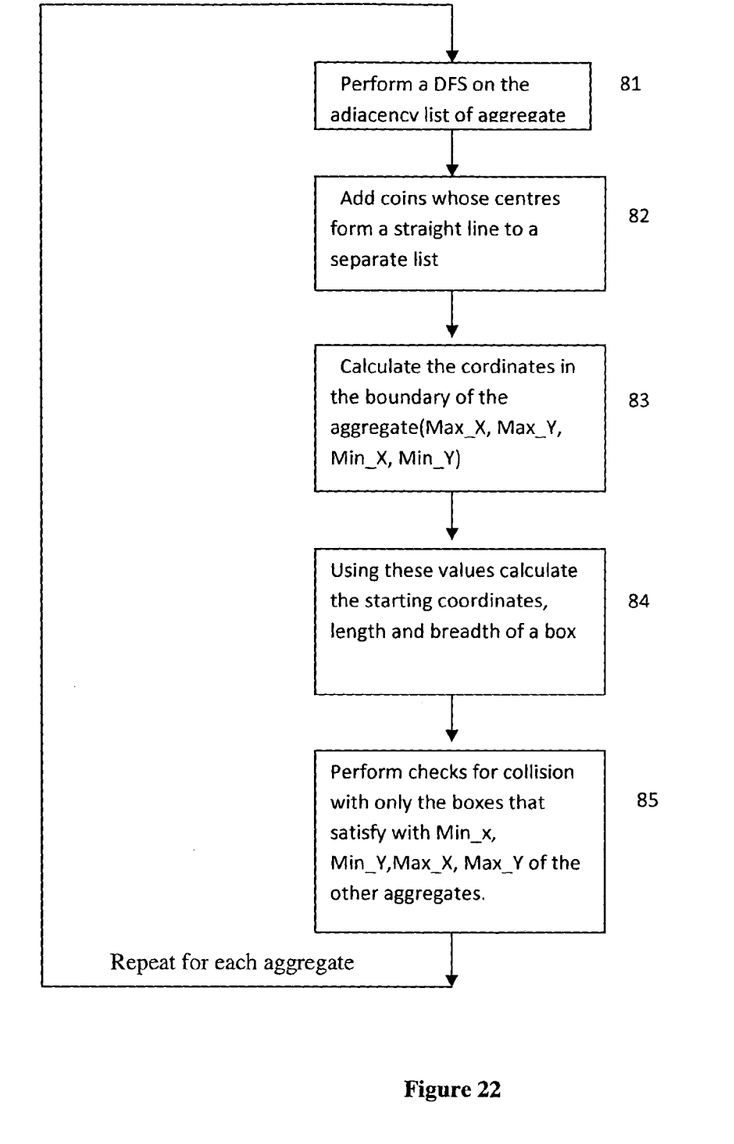
FIG. 22 shows a flowchart summarizing the method of approximation using a union of bounding box.

FIG. 11 shows an approximation using a union of bounding box; The flowchart in FIGS. 22 (81 to 85) summarizes the method used.

Pre-Computed Bounding Boxes

When there are a large number of coins in the cluster, we can optimize the method of bounding box or circles, by caching some pre-computed coin clusters. The idea is to break up a complex aggregate into simpler ones. The bounding boxes for the simpler aggregates can be pre-computed and stored in a database. This will make the entire computation efficient by just looking at portions of the aggregate rather than the entire aggregate.

Portions of the aggregate will belong to a separate bounding region. This will greatly improve the bound of the aggregate within the box and as a result an aggregate can be modelled as a union of tight bounding boxes. As discussed in the previous section, in the method for creating a union of rectangular bounding boxes, which did not use the concept of pre computed coin clusters/aggregates. The method outlined here combines the concept of pre computation of aggregates and union of bounding boxes.

Figure 23:
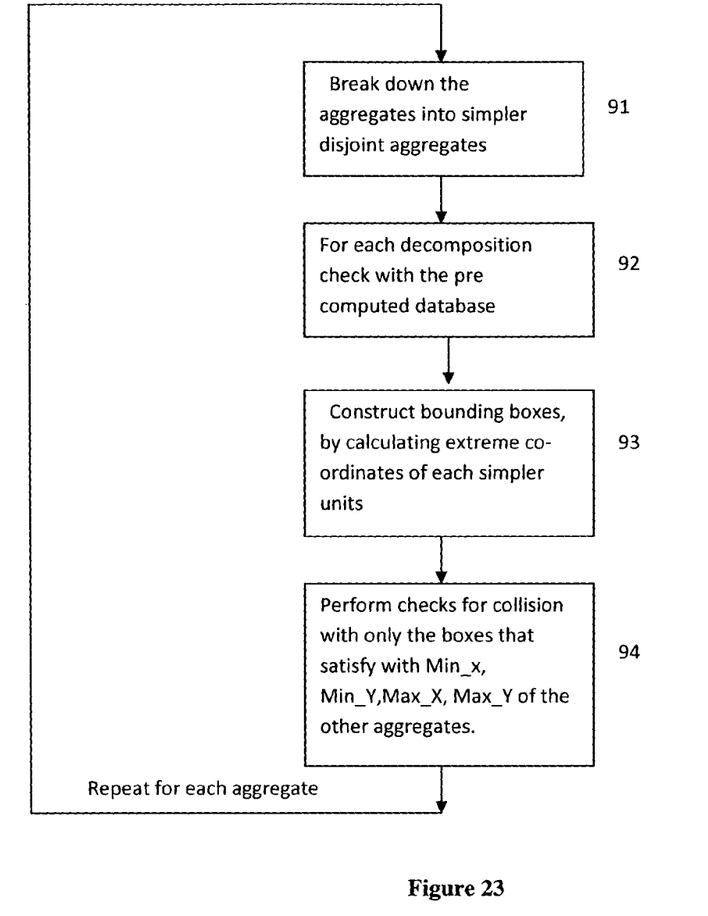
FIG. 23 shows a flowchart summarizing the method of collision among bounding boxes belonging to different aggregates only.

As is the case with union of bounding boxes, with pre-computed coin clusters also, collision among bounding boxes can be detected belonging to different aggregates only. This method is outlined in FIGS. 23 (91 to 94).

Results from an Exemplary Embodiment

In this section the results obtained from two modules of the invention is discussed. The first one is the calculation of vector fields. From the magnetic field, magnetic force and torque is also calculated using the magnetic field software modelling and pre-computed databases. The results are then simulated in OpenGL.

For the collision detection of coin clusters, we have tested with different number of coins and different shapes of clusters. Performance results based on this has been presented.

Following this, the modelling of a bar magnet is performed in terms of the vector intensities varying from the core of the magnet. This was done using a solenoid modelling of the bar magnet.

Our invention implements a data base approach by pulling the vector information from the data base, which were in turn taken and inserted from magnetic field software. The angle between the vectors is calculated using the x and y components.

Circular Vector Field

Figure 12:
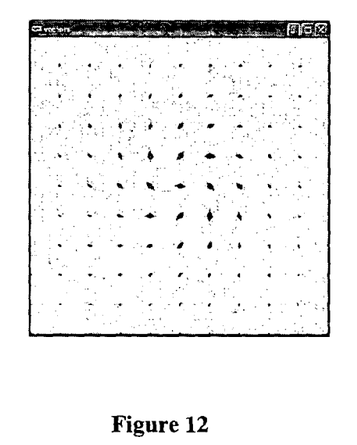
FIG. 12 shows vector field for force diverting into four quadrants.

FIG. 12 illustrates a vector field representation of a vortex of force. A whirlpool is visualized here.

Interactive Vector Field Visualization for a Fictional Uni-Pole

Figure 13:
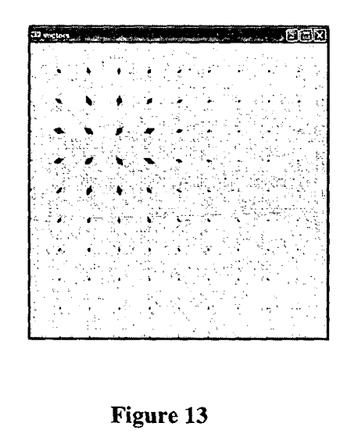
FIG. 13 shows vector visualization for attraction field on mouse coordinates.

FIG. 13 shows how the resultant vectors will be pointing to a particular uni pole. For each vector, resultant angle towards that particular pole is calculated and updated.

Vector Visualization of Fields Getting Diverted to Four Quadrants

Figure 14:
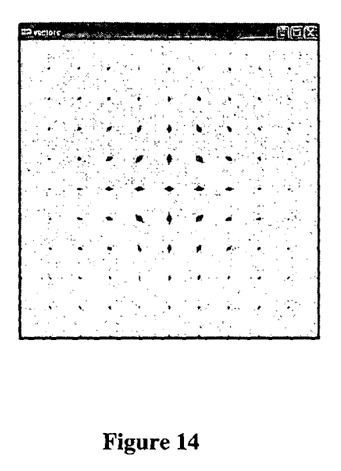
FIG. 14 shows vector field representing a whirlpool force.

FIG. 14 shows vector field representing a whirlpool force. The vector field here shows the mapping of window coordinates to Cartesian coordinates, so that, using the Cartesian coordinates will ease the use of calculations and computations. For example, a particular point in a coordinate system can be known in which quadrant it is present.

Vector Visualization of Two Separate Uni-Poles

Figure 15:
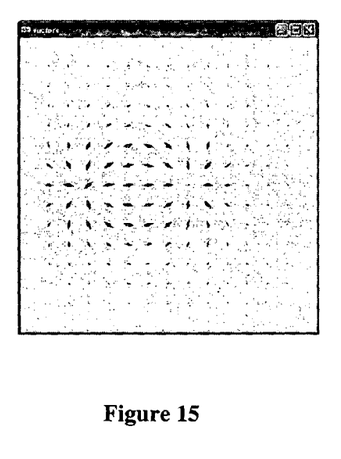
FIG. 15 shows vector field representing two Uni poles.

FIG. 15 shows vector field representing two Uni poles.

Figure 16:
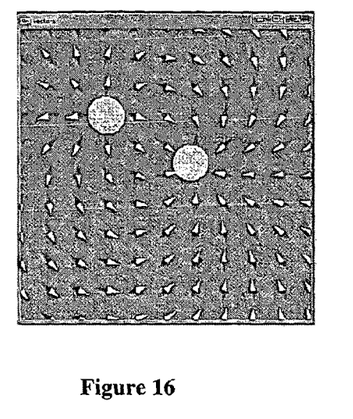
FIG. 16 shows two coins attracting each other with opposite uni poles inside them.

FIG. 16 shows two coins attracting each other with opposite uni poles inside them.

In this case, two fictional unipoles, north and south are placed at a distance and the vector field is shown. This indicates that when opposite poles are near to each other they attract and similarly when the like poles are near to each other they repel. In both the cases the vector field is uni-directional.

Visualization of Magnetic Intensity of a bar magnet

Figure 17:
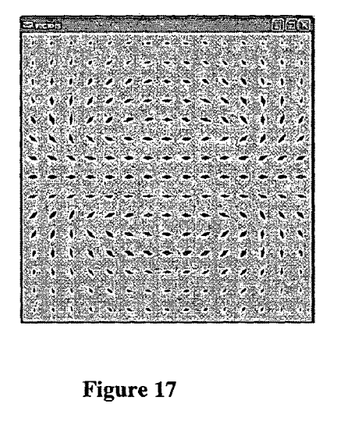
FIG. 17 shows vector field representing a bar magnetic field.

FIG. 17 shows vector field representing a bar magnetic field.

Figure 18:
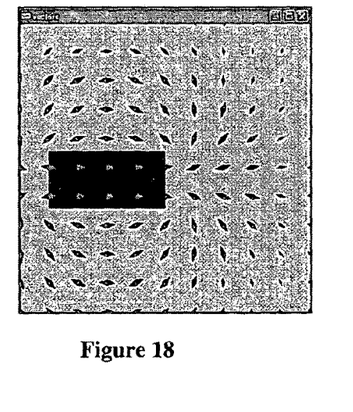
FIG. 18 shows vector field representing a moving bar magnetic field.

FIG. 18 shows vector field representing a moving bar magnetic field.

Refer FIGS. 17 and 18 for the output. Here, a bar magnet is modelled using a solenoid. A bar magnet is an object with attributes. Points in the bar magnet correspond to the current carrying coil that actually represent a bar magnet. Vector field here is bi-directional i.e inside the magnet, direction of vector field is from south to north and outside the magnet the direction is from north to south.

Figure 19:
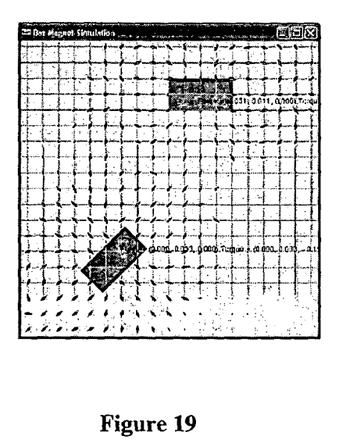
FIG. 19 shows magnetic field for 4 magnets every pair being perpendicular to the other.
Figure 20:
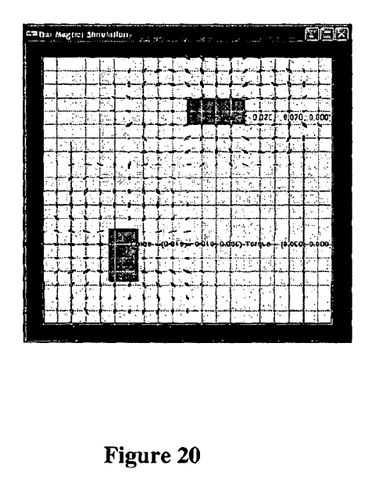
FIG. 20 shows magnetic field for 4 magnets with random orientation.

Further, the presence of two pairs of Bar magnets are modelled and the vector field is visualized. FIGS. 19 and 20 depict this behaviour.

FIG. 19 shows magnetic field for 4 magnets every pair being perpendicular to the other.

FIG. 20 shows magnetic field for 4 magnets with random orientation.

The former one shows the resultant field when the pairs of magnet each with unlike poles facing each other are perpendicular. The latter one show the resultant field when one of the pairs is placed in a random orientation.

Exemplary Embodiments of the Invention

A game system can be designed, where the user can choose coins of his/her own choice, simulate the resulting games, and then have the physical coins delivered to them if needed [23]. The database can have a magnetic fields corresponding to an arbitrary number of magnets in each coin. Different coin shapes—circular, triangular, square, etc can all be provided. The magnet shapes, positions, and orientations, etc can also be different, as per earlier patent application [23]. The shapes and orientations can be so chosen as to generate any desired field distribution, ranging from simple to complex. During the simulation, all relevant physical quantities are available—and can be used to verify various physical laws—conservation of energy/momentum [23].

The user chooses or designs a set of coins and starting configurations and simulates playing the resulting game, using the database, which can be precomputed or generated on the fly, from any standard magnetics engine like ANSYS/FEMM. Note that the database may contain B (field strength) or F (force between two magnets). The B/F database can also be improved by learning from actual physical games—a high quality B/F database can be used to train a robotic carom player, by simulation alone.

The simulator can run on a laptop/desktop or can also be a web service. It can also be an application on a mobile—this is quite feasible, since the heavy Maxwell equation computations are avoided. The game can be played on multiple mobiles, communicating with each other. The database enables the user to simulate many different games.

Once the player has a game of their liking, they can order the physical coins/hardware. The coins will be manufactured, along with generation of their B or F database. Note that an ID can be imprinted on the coins during manufacture, to unambiguously identify the relevant database. This gives the user the ability to simulate and design, and have manufactured, many magnetic carom games of their own choice. An active striker, with its own processor and actuators and the database can be incorporated in it [23].

Note that exactly the same ideas can be applied to other board games—billiards, snooker, pool, etc. With spherical balls, the database has to be 3-D. The invention can also be applied to illustrate concepts of chemical reactions—with the coins being atoms, and the aggregates molecules. When two mechanisms with magnets interact with each other, one or both can change configuration, leading to very interesting effects.

The simulator can be applied to train a computer actuator to play the game, with high speed game dynamics being simulated using the database.

REFERENCES

1. Thomaszewski B, Gumann A, Pabst S, Straer W, 2008, Magnets in Motion, ACM Trans. Graph. 27, 5, Article 162, (December 2008), 9 pages, DOI=10.1145/1409060.1409115.
2. David Meeker, Finite Element Method Magnetics,"
3. Geer D, Vendors Upgrade Their Physics Processing To Improve Gaming, August 2006, Volume 39, Issue 8, Pages 22-24, DOI=10.1109/MC.2006.284.
4. Brauer, J. R., Finite Element Modeling of Permanent Magnet Devices, March 1984, Volume 55, Issue 6, Pages 2183-2185, DOI=10.1063/1.333604.
5. DELFINO, F., MANELLA, A., MOLFINO, P., AND ROSSI, M. 2001. Numerical calculation of total force upon permanent magnets using equivalent source methods. COMPEL: The International Journal for Computation and Mathematics in Electrical and Electronic Engineering 20, 2, 431-447.
6. Nicolet, A., 1996. Implicit Runge-Kutta methods for transient magnetic field computation Magnetics, IEEE Transactions on, Volume: 32, Issue: 3 Page(s): 1405-1408.
7. Barton M. L, 1987, New vector finite elements for three-dimensional magnetic field computation, Journal of Applied Physics, Volume: 61, Issue: 8 Page(s): 3919-3921.
8. JACKSON, J. D. 1999. Classical Electrodynamics, 3rd ed. Wiley, New York.
9. LANDAU, L. D., LIFSHITZ, E. M., AND PITAEVSKII, L. P, 1984 Electrodynamics of continuous media, 2nd ed. Pergamon Press, Oxford.
10. M. Elimelech, John Gregory, Xiadong Jia, Richard Williams, Particle Deposition and Aggregation: Measurement, Modelling and Simulation.
11. Ming C. Lin, Stefan Gottschalk, 1998, Collision Detection Between Geometric Models: A Survey, In Proc. of IMA Conference on Mathematics of Surfaces, Pg 37-56.
12. Lin, M. C., & Gottschalk, S. (1998). Collision detection between geometric models: A survey. IMA Conference on Mathematics of Surfaces.
13. Arvo, J., & Kirk, D. (1989). A survey of ray tracing acceleration techniques. In A. Glassner (Ed.), An introduction to ray tracing (pp. 201-262). San Diego, Calif.: Academic Press.
14. Gab, X-S., & Wang, D-K. (1992). On the automatic derivation of a set of geometric formulae. Mathematics Mechanization Research Preprints, 8, 26-37.
15. Kapur, D., Saxena, T., et al. (1994). Algebraic and geometric reasoning using Dixon resultants. Proceedings of the International Symposium on Symbolic and Algebraic Computation, Oxford, UK.
16. Shpitalni, M., & Lipson, H. (1997). Automatic reasoning for design under geometric constraints. Annals of the CIRP, 46(1), 85-89.
17. Bergen, G. (1999). A fast and robust GJK implementation for collision detection of convex objects. Journal of Graphics Tools, 4(2), 7-25.
18. Cohen, J., Lin, M., et al. (1995). I-COLLIDE: An interactive and exact collision detection system for large-scale environments. Proceedings of the ACM Interactive 3D Graphics Conference.
19. Ehmann, S., & Lin, M. (2001). Accurate and fast proximity queries between polyhedra using convex surface decomposition. Proceedings of Eurographics.
20. Gottschalk, S., Lin, M., et al. (1996). OBB-tree: A hierarchical structure for rapid interference detection. Proceedings of ACM SIGGRAPH.
21. Klosowski, J. T., Held, J. T., et al. (1998). Efficient collision detection using bounding volume hierarchies of k-DOPs. IEEE Trans. Visualization and Computer Graphics, 4(1), 21-37.
22. Jiménez, P., Thomas, F., et al. (2001). Collision detection: A survey. Computers & Graphics, 25(2), 269-285.
23. Prasanna, G. N. S et. al (2010). Indian Patent Application No. 2684/CHE/2010; titled "Magnetic Carom".

The invention claimed is:

1. A system for a high speed gaming engine by for calculating a magnetic force and collision detection between one or more coin clusters involved in a magnetic carom to solve the problem of dynamics in the presence of a electromagnetic field, the system comprising:
   a) game board components comprising:
      a board containing a plurality of pockets one at each corner;
      one or more coins with identical size and shape; and a striker;

b) software components comprising computer instructions and/or algorithms for carrying out a method for a circular bounding area comprising the steps of:

calculating the center of mass of each of the one or more coins;

calculating one or more coordinates in a boundary of one or more aggregates of the one or more coins;

calculating a radius and center of a bounding circle of the one or more aggregates of the one or more coins;

checking for a collision geometrically at each time step, using the radius and the center of mass; and checking for an intersection of one or more bounding circles of the one or more aggregates with only the coin that satisfies with Min_x, Min_Y, Max_X, Max_Y of at least one of the one or more aggregates; and c) computer hardware components for carrying out the computer instructions and/or algorithms, the computer hardware components being at least one of a laptop computer, a desktop computer, web services devices, and mobile devices, wherein the one or more coins form the one or more aggregates upon collision with each other, and the collision is detected by computing the one or more aggregates and union of a bounding box.

2. The system according to claim 1, wherein the board is square in shape.

3. The system according to claim 1, wherein the one or more coins are embedded with one or more magnets.

4. A method for a high speed gaming engine for calculating a magnetic force and collision detection between one or more coin clusters involved in a magnetic carom, comprising a method for determining a circular bounding area comprising the steps of:

a) calculating the center of mass of each of the one or more coins;

b) calculating one or more coordinates in a boundary of one or more aggregates of the one or more coins;

c) calculating a radius and center of a bounding circle of the one or more aggregates of the one or more coins;

d) checking for a collision geometrically at each time step, using the radius and center of mass; and e) checking for an intersection of one or more bounding circles of the one or more aggregates with only the coin that satisfies with Min_x, Min_Y, Max_X, Max_Y of at least one of the one or more aggregates, wherein steps a) through e) are carried out using software components comprising computer instructions and/or algorithms for carrying out the method for determining the circular bounding area on computer hardware components for carrying out the computer instructions and/or algorithms.

5. The method according to claim 4, wherein collision detection comprises the steps of:

a) performing a DFS on an adjacency list of the one or more aggregates of the one or more coins;

b) adding one or more coins with centers forming a straight line to a separate list;

c) calculating one or more coordinates in a boundary of the one or more aggregates Max_X, Max_Y, Min_X, Min_Y;

d) calculating a starting coordinate, a length, and a breadth of a bounding box using the values determined in step c);

e) checking for the collision with only the bounding boxes that satisfy with Min_x, Min_Y, Max_X, Max_Y of the one or more aggregates; and f) repeating the steps a)-e) for each of the one or more aggregates.

6. The method according to claim 4, further comprising pre-computation of the one or more aggregates and union with the bounding box, comprising the steps of:

a) breaking down the one or more aggregates into a plurality of simpler disjoint aggregates;

b) checking for each decomposition with a pre-computed database;

c) constructing the bounding box by calculating an extreme co-ordinate of each simpler unit;

d) checking for the collision with only the bounding boxes that satisfy with Min_x, Min_Y, Max_X, Max_Y of the one or more aggregates; and e) repeating the steps a)-d) for each of the one or more aggregates.

7. The method according to claim 4, further comprising a simulator comprising the steps of:

a) calculating a dynamic module position at the time step;

b) checking for the collision between the one or more aggregates and a coin in a collision detection module;

c) calculating and returning the magnetic force between the one or more coins in a magnetic force computation module; and d) updating the position of the one or more coins and the one or more aggregates based on values returned by the magnetic force computation module in the dynamics module.

* * * * *